United States Patent [19]
Klingel

[11] Patent Number: 5,354,577
[45] Date of Patent: Oct. 11, 1994

[54] PROCESS FOR APPLYING A PROTECTIVE PLASTIC FILM, AND A DEVICE FOR CARRYING OUT THE PROCESS

[76] Inventor: Wolfgang Klingel, Leonberger Strasse 86, W-7259 Friolzheim, Fed. Rep. of Germany

[21] Appl. No.: 941,439

[22] PCT Filed: Feb. 13, 1991

[86] PCT No.: PCT/EP91/00280
§ 371 Date: Oct. 23, 1992
§ 102(e) Date: Oct. 23, 1992

[87] PCT Pub. No.: WO91/16806
PCT Pub. Date: Oct. 31, 1991

[30] Foreign Application Priority Data
Apr. 23, 1990 [DE] Fed. Rep. of Germany ....... 4012903

[51] Int. Cl.⁵ .............................................. B05D 1/00
[52] U.S. Cl. .................................. 427/96; 427/430.1; 118/211; 118/404; 118/407; 118/421; 118/500
[58] Field of Search ............... 427/96, 430.1; 118/211, 118/404, 500, 407, 421

[56] References Cited
U.S. PATENT DOCUMENTS
3,853,663 12/1974 McGlashen ..................... 427/284
4,684,544 8/1987 Arnett ............................. 427/96
4,794,018 12/1988 Schertz ........................... 427/96

*Primary Examiner*—Shrive Beck
*Assistant Examiner*—Vi Duong Dang
*Attorney, Agent, or Firm*—Flynn, Thiel, Boutell & Tanis

[57] ABSTRACT

A protective film of plastic is applied to a printed-circuit board fitted with electronic components on at least one side. In order to keep some areas free of plastic film, a vat has an exposed rim which corresponds in shape to the outline of the surface(s) to be coated and lies in a single plane. The circuit board is placed, with the side to be partly coated facing inward, against the coplanar rim of the vat and is pressed against the rim defining the shape of the surface(s) to be coated. The vat is subsequently pivoted, together with the circuit board on it, into a position in which the circuit board forms the floor of the vat and liquid coating material contained in the vat spreads over the surface(s) to be coated, wetting them. The vat is then pivoted into a position in which excess coating material can drain off the circuit board.

16 Claims, 2 Drawing Sheets

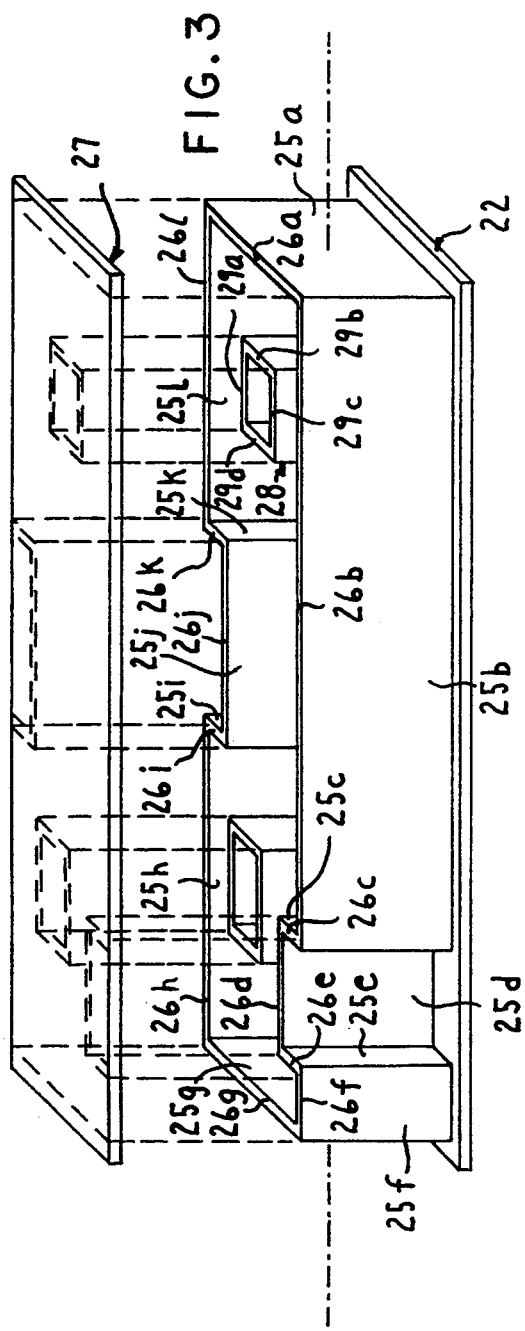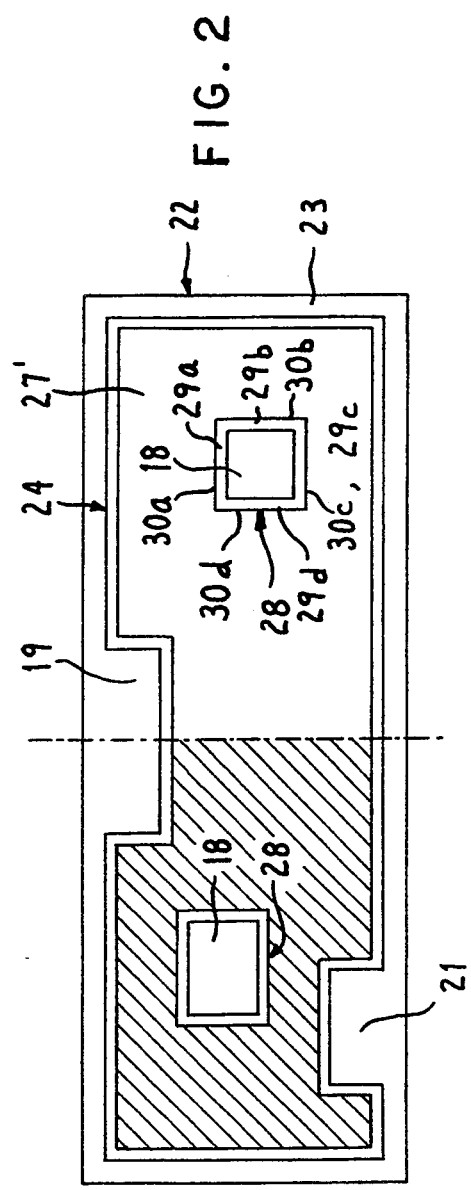

PROCESS FOR APPLYING A PROTECTIVE PLASTIC FILM, AND A DEVICE FOR CARRYING OUT THE PROCESS

FIELD OF THE INVENTION

This invention relates to a process for applying a protective plastic film to a printed circuit board fitted with electronic components on at least one side and to a device for carrying out this process.

BACKGROUND OF THE INVENTION

In order to protect electronic components, which in today's technology are arranged on a side of printed circuit boards with preapplied conductor strips, for example from corrosion, it is known to coat these components and the parts of the printed circuit boards carrying these components with an insulating lacquer, which also protects the conductor strips printed on the circuit board against short-circuits which can be caused by dirt.

Such films can be manufactured using the so-called dipping process. However, surface areas which are not to be coated, for example surface areas which must have exposed conductors in order to enable contact with further printed circuit boards or supply connections, must then be covered through expensive gluing operations. This process is time-consuming and therefore expensive. The same is true when the printed circuit boards are coated by applying the insulating lacquer with a brush, which may yet be economical when the printed circuit boards are very small and/or when only small areas or areas with a very complicated design must be coated, namely in special cases and only in small quantities.

For the above purpose it is also known to utilize coordinate-controlled coating devices, which apply the coating linearly, either by pouring or by spraying. However, such devices are not only expensive, but also operate relatively slowly because of the linear application of the coating, with the result that their use, regardless of the achievable automation of the coating process, is also expensive.

A summary of possible coating processes is disclosed in the publication by Peter A. Knoedel "The protective lacquering of occupied printed circuit boards", Metalloberflaeche, 1989/4+5.

A process known from U.S. Pat. No. 4,794,018 is also part of these known processes, in which process the printed circuit boards which are to be coated are engaged by a stream of liquid coating material guided through a flat vat. The stream is created by a pump, which moves the coating material from a storage container into the vat, from which the coating material can flow off into a lower lying collecting vessel. Depending on the depth of immersion of the printed circuit boards, both their underside and also their upper side can thereby be coated. Edge areas which are not supposed to be coated are arranged outside of wall recesses of the vat, through which recesses the coating material can flow off into the collecting vessel. It is practically impossible with this process to exclude inner areas of the boards, which are enclosed by areas to be coated, from the coating.

Further coating processes, by means of which precisely limited areas of bodies can be coated, are known from German Offenlegungsschrift No. 28 48 569 and from U.S. Pat. No. 3,853,663.

The process according to German Offenlegungsschrift 28 48 569 is used for coating ceramic or porcelain articles like cans, vases or the like with a glazing material, in which all surface areas must be glazed with the exception of a circular, narrow, lower outer edge of the bottom which, in its center area, is slightly concavely inwardly arched. The container is placed onto a flexible plate, which covers the inside of a storage container for the glazing material, but which has one opening through which the inside of the container communicates with the flatly concavely arched space defined by the arched bottom, which space is bounded by the base. The article is pressed against the flexible plate by a vacuum induced inside of the storage container not filled with the glazing material. By pivoting the storage container and the article held on the storage container, the bottom area within the base is glazed. By dipping the article with the storage container still attached into a further storage container, which is filled with glazing material, the remaining surface of the article is glazed, which surface is formed by its outer and inner wall surfaces and the inside of its bottom.

The process known from U.S. Pat. No. 3,853,663 is used to coat circular surfaces of tennis ball halves which have the shape of half shells of a ball with a liquid adhesive, and which after their annular surfaces are coated are pressed on one another in order to achieve a material-flow fixedly connected ball shell core- The ball halves to be coated are thereby arranged above the liquid level of the adhesive provided in a container so that the annular surface used for gluing is spaced a small distance from this level. A ring is arranged in the container below the liquid level, the average diameter of the ring corresponding with the average diameter of the surface to be coated. By lifting this ring, an annular wave of coating material is, so to speak, produced between the ring and the annular surface to be coated, which wave reaches the annular surface of the ball half and moistens same. This process has the purpose of assuring that only the annular edge of the ball halves is coated, and not the outer areas of the ball halves, which would make their further treatment more difficult. At best, "linear" areas of bodies to be connected with one another can be coated with this process, but not flat areas which have relatively large cross-sectional surfaces.

In view of the above-mentioned disadvantages of known coating processes, a purpose of the invention is first to provide a process of the above-mentioned type which enables an efficient and reliable coating of complicated coating surfaces on printed circuit boards, and a device for carrying out the process.

SUMMARY OF THE INVENTION

This purpose is attained with respect to the process by the steps of providing a vat wall which has exposed rims of its walls or wall sections shaped to correspond with the contour of the surface(s) to be coated and extending in a plane or surface which corresponds in shape with the plane or surface containing the contours of the surface(s) to be coated, moving the side of the printed circuit board which is to be partially coated into abutment with the coplanar exposed rims and pressing the circuit board on these rims which correspond with the shape of the surface(s) to be coated, and moving the vat wall and the printed circuit board engaging it into a position in which the printed circuit board forms the lower base of the vat and the coating material in the vat can spread over the surfaces to be coated to wet same, thereafter moving the vat with the printed circuit board into a position in which the excess coating material drains off from the printed circuit board, and thereafter removing the circuit board and subjecting the circuit board to a drying or hardening operation.

Advantages of the process of the invention resulting from this include at least the following:

It can be carried out in cycle times which are significantly shorter than the cycle times achievable for example with coordinates sealing machines or the like. It can be used both for printed circuit boards fitted with relatively tall electronic components and also for printed circuit boards fitted with only relatively short electronic components, since the area to be coated in a direction perpendicular to the surface to be coated can be adjusted very easily by a suitable selection of the depth with which the vat is filled with coating material.

The quality of the coating is very good, since "shadow edges" do not at all occur and components which stand for example on connecting legs can be enclosed and can be wetted all around with the coating material. A quality of the coating is achieved which corresponds with a quality achievable with known dipping processes.

The process is sufficiently protective regarding the printed circuit boards to reliably prevent damage to these printed boards.

With respect to the device for carrying out the invention, the above-mentioned purpose is attained which by a simple device suited to carry out the process of the invention, in which a vat includes a plate-shaped base part from which vertically project vat wall sections and chimney wall sections for defining chimneys which protect island-shaped areas on the printed circuit board that are to remain free of film, in which the vat can be fixed with its base plate in a defined position on a support plate to extend parallel to a base plate and a yoke plate which are spaced from one another and are connected fixedly with one another to form a frame, the support plate being arranged between these plates and being movable back and forth vertically with respect to these plates, in which the yoke plate has an opening with edges on which the printed circuit board can be fixed in a defined position with the side to be coated facing toward the vat so that the contours of its surface(s) to be coated are arranged congruent with inner edges of the exposed rims of the wall sections forming the vat wall; and in which the frame is supported pivotally about a horizontal axis on a machine frame, with an angle of traverse, with reference to a base position of the frame in which its base plate extends horizontally and is below the support plate, being at least 180°.

It is possible, when the vat is sufficiently quickly pivoted, to hold the coating material on the vat base through centrifugal force so that it flows or "falls" onto the printed circuit board only when the pivoting movement has ended. The frame is pivoted upwardly with the vat in this design of the device.

The centrifugal force occurring during pivoting of the vat in the design of the device disclosed in claim 4 can be utilized, so to speak, to throw the coating material against the printed circuit board and to thus accelerate the coating process, with the frame and the vat being pivoted downwardly in this design of the device.

A design of the device in which the frame pivot axis extends in or slightly above the plane of an inner surface of the base plate is neutral with respect to centrifugal force and has the advantage that the space needed for pivoting of the device is minimal.

A closing plate provided for holding the printed circuit board on the upper side of the apertured plate of the pivotal machine frame can be supported for movement perpendicular to the yoke plate on bolts arranged on both sides of the opening of the apertured plate, and can be held in a closing position by means of a spring-elastic tensioning device.

A refinement of the closing plate includes a pressure cushion facing the soldering side of the printed circuit board, so that it is possible to coat the printed circuit board on both sides during a single working cycle.

Combined with this, a design and arrangement of the holding plate in which the holding plate pivots about an axis spaced from and parallel to an edge of the opening in the yoke plateis particularly advantageous in that, in the opened state of the holding plate, a comfortable soaking of the pressure cushion is possible and also in this regard an advantageously short working cycle is guaranteed.

BRIEF DESCRIPTION OF THE DRAWINGS

Further details and characteristics of the invention appear in the following description of one exemplary embodiment in connection with the drawings, in which:

FIG. 2 is a top view of the vat according to FIG. 1, and FIG. 3 is a perspective view of the vat according to FIG. 2, and a printed circuit board coatable with the material in the vat.

DETAILED DESCRIPTION

Figure 1:
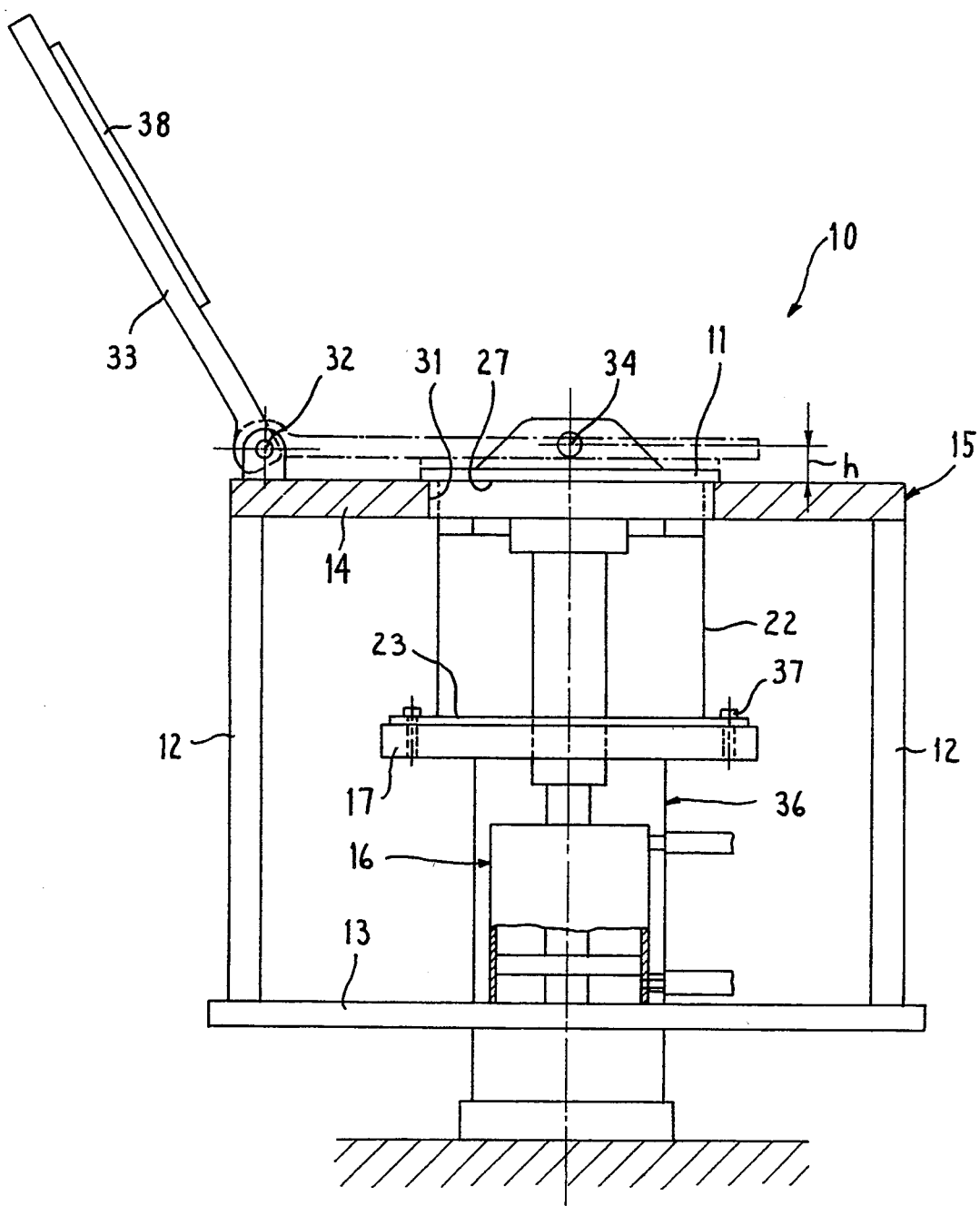
FIG. 1 is a simplified diagrammatic side view of a device of the invention for applying a plastic film to the side of a printed circuit board fitted with components, including a pivotal frame on which a vat is movable up and down to receive the coating material in a liquid state, which vat can be pressed with the exposed rims of its outer walls against the printed circuit board.

The device of the invention, which in its entirety is identified with reference numeral 10, which is illustrated in FIG. 1, to the details of which reference is made, and which is used for applying insulating films such as lacquer films to the side of a printed circuit board fitted with electronic components, is constructed like a press which includes a yoke plate 14 as the press frame 15, the plate 14 being fixedly connected to a base plate 13 through posts 12. The yoke plate is spaced from the base plate 13 and extends parallel to the base plate—horizontally in the illustrated operating position.

A stroke driver designed as a pneumatic cylinder 16 is provided as the "press" drive between the yoke plate 14 and the base plate 13 in the illustrated exemplary embodiment. A support plate 17, which in turn extends parallel with respect to the yoke plate 14 and the base plate 13, can be lifted and lowered between the base plate 13 and the yoke plate 14 by means of this drive.

It is assumed that the printed circuit board 11 is supposed to be coated with an insulating lacquer only on some areas of its side fitted with electronic components. Islandlike areas 18 and/or rim areas 19 and 21 of the printed circuit board 11, for example, are thereby supposed to remain free of film, which can best be seen in FIG. 2.

To make this possible, a vat identified in its entirety with reference numeral 22 is provided as an operationally important element of the device 10. The vat has a flat platelike base 23 and a vat wall 24 tightly attached to the base, which vat wall is made, in the illustrated exemplary embodiment, just like the vat base 23 from a thin sheet metal which is soldered or welded to the vat base 23.

The vat wall 24 is manufactured as a bent part of a strip of sheet metal with a width of between 4 and 10 cm and has edges which extend very precisely parallel to one another. It is constructed so that when viewed according to the illustration of FIG. 3, the upper, narrow rims 26a to 26l of the rectilinearly extending outer wall sections 25a to 25l of the vat wall, its inner edges which extend along the outer contour of the surface portion 27 of the printed circuit board 11 which is to be coated.

In the illustrated exemplary embodiment, in which the vat wall 24 is positioned vertically on the base 23 of the vat 22, the inner base surface 27' of the vat 22 corresponds with this surface potion 27 to be coated on the printed circuit board 11. The islandlike areas 18 of the printed circuit board 11 which are to remain free of film are, according to the illustration of FIGS. 2 and 3, excluded by "chimneys" which project vertically upwardly from the base 27' of the vat 22. The upper narrow rims 29a to 29d of the rectilinearly extending chimney wall sections 30a to 30d extend thereby coplanar with the upper narrow rims 26a to 26l of the wall areas 25a to 25l connected at right angles with one another in the illustrated exemplary embodiment.

The yoke plate 14 of the device 10 has an opening 31, which as a rule is rectangular and which has an inside length and width chosen so that the vat 22 can be guided with its upper wall area with a sufficient inside distance from the longitudinal and transverse borders of said opening 31 into same and can with its rims 26a to 26l abut the printed circuit board 11, which in turn is supported by its edge sections on the longitudinal and/or transverse edges of the yoke plate 14. A closing plate 33 is further more supported pivotally about a horizontal axis 32 on the frame 15, in the illustrated exemplary embodiment on the upper side of the yoke plate 14. The printed circuit board 11, which is to be coated, can be held by means of this closing plate 33 with a minimum closing force in abutment with the yoke plate 14 of the machine frame 15.

This machine frame 15, including the base plate 13 and the yoke plate 14 and also the posts connecting these plates with one another, is in turn supported pivotally about a horizontal axis 34 on an only diagrammatically indicated stationary machine frame 36, with the pivot axis 34 located, in the illustrated exemplary embodiment, at a vertical distance h above the upper side of the yoke plate 14.

The above-discussed device 10 is used as follows for applying the insulating film to the side of the printed circuit board 11 fitted with components, with the method of the invention, which is also the subject matter of the invention, being discussed in connection with the description of this use.

A quantity of liquid film material, for example an acrylic or a polyurethane lacquer, is placed into the vat 22 in the lowered position of the support plate 17 and of the vat fastened, for example by means of screws 37, to the support plate, which quantity is sufficient to coat several hundred printed circuit boards. This means in reality that the vat 22 is filled with the insulating lacquer to a depth of 2 cm. The needed depth, of course, depends on the structural height of the components which all together must be coated, and on the number of printed circuit boards 11 to be coated.

After the vat 22 has been filled with the film material in this manner, the printed circuit board 11 is placed in a position exactly defined, for example by means of stops and with the side to be coated facing downwardly, over the opening 31 of the yoke plate 14, with the adjusting of the printed circuit board 11 on the one hand, and the fixing of the vat 22 on the support plate 17, on the other hand, being coordinated with one another so that when the vat 22 is lifted, the upper exposed rims 26a to 26l of the vat wall 24 precisely enclose the surface areas of the printed circuit board 11 which are to be coated.

After the printed circuit board 11 has been placed onto the yoke plate 14, the closing plate 33 is moved into its closed position, in which it securely holds the printed circuit board 11 against the yoke plate 14 and fixes the board in this closed position. A locking mechanism provided for this purpose is not illustrated for reasons of simplicity.

The vat 22 is thereafter lifted, by activating the stroke driver 16, and the upper, narrow rims 26a to 26l of its vat wall 24 are urged with a force limited in the illustrated special exemplary embodiment, for example by a not-illustrated pressure-limiting valve, against the surface of the printed circuit board 11 to be coated. The circuit board forms now, in this position, a lid closing off the vat 22. The machine frame 15 is thereafter pivoted 180° upwardly about the horizontal axis 34 so that, for a defined short period of time, the printed circuit board 11 becomes the vat base. The coating material comes in this position into a wetting contact with the surface of the printed circuit board to be coated and the components projecting from the base of the vat, which base is formed by the printed circuit board, are now wetted within the depth of the coating liquid which, of course, must be sufficiently deep when a coating completely enveloping the components is needed.

After the mentioned time span, which in reality is only a few tenths of a second, the pivotable frame 15 is pivoted back into the base position illustrated in FIG. 1, in which the excess coating material can drain off the printed circuit board 11.

This drainage can also be simplified if the machine frame 15, prior to being pivoted back into the position corresponding with the horizontal position of the vat base 23 illustrated in FIG. 1, is held first for some seconds in a position in which the vat base 23 and thus the vat wall 24 are sloped, for example are inclined at 45°, which can accelerate the drainage of the coating liquid from the printed circuit board 11 and from the inner side of the vat wall 24. A pressure cushion 38 is, in a preferred embodiment of the device 10, arranged on the side of the closing plate 33 which side comes into contact with the outside of the printed circuit board, the so-called soldering side, by means of which pressure cushion, with a pressure process, the soldering side of the printed circuit board 11 can be coated with an insulating lacquer.

This pressure cushion 38 can, while the device is "open" in order to remove the printed circuit board 11, namely while the closing plate 33 is in its horizontal open position, be easily soaked with the coating material.

In a further, not separately illustrated embodiment of the device 10, this device can be modified so that the vat wall 24 is constructed as a separate cooperating element which is not provided with a base fixedly connected to the wall 24. The device 10 is then designed and used in such a manner that the vat wall 24 sits on a pivotable mounting and the printed circuit board can be pressed from an exposed side, for example from above, against the vat wall 24 with a minimum of force and can be fixed in this position. The printed circuit board 11 together with the vat wall 24 is then pivoted into a position in which the coating material can be poured from above by a filling device into the vat, which can thereafter be emptied into a storage container by "draining" the excessive coating material. The coated printed circuit board can thereafter be removed advantageously, from a position in which it is arranged on the upper side of the vat wall 24 opening downwardly toward the storage container, from the vat wall 24. With this design, the device 10 of the invention has the advantage that, per working cycle, relatively little coating material must be poured into the vat formed by the wall 24 and the printed circuit board 11, which can, if necessary, be supported by pressure.

On the other hand, the structure required is larger as a whole than in the device 10 discussed and illustrated as the exemplary embodiment.

It is to be understood that the vat 22 need not necessarily be manufactured of sheet metal, but may also be manufactured of plastic parts which are fixedly connected with one another by gluing or welding.

It is further more understood that, in the place of a pneumatic stroke driver 16, it is also possible to provide a hydraulic or manually operable, resiliently supported, mechanical extender driver, which permits the vat wall 24 to be pressed with a defined force against the printed circuit board 11.

The embodiments of the invention in which an exclusive property or privilege is claimed are defined as follows:

What is claimed is:

1. In a process for applying a protective plastic film to a printed circuit board fitted with electronic components on at least one side, on which printed circuit board there are also areas which are fitted with such components and are to be kept free of film, including a vat into which a coating material in a liquid state is introduced, with the coating material and the surface(s) of the printed circuit board to be coated are brought into a wetting contact, after which the wetted and surface coated printed circuit board is subjected to a drying operation during which the coating is hardened, the improvement comprising the steps of: providing a vat wall which has exposed rims of its walls or wall sections shaped to correspond with the contour of the surface(s) to be coated and extending in a plane or surface which corresponds in shape with the plane or surface containing the contours of the surface(s) to be coated, moving the side of the printed circuit board which is to be partially coated into abutment with the coplanar exposed rims and pressing the circuit board on these rims corresponding with the shape of the coating surface(s), and moving the vat wall and the printed circuit board engaging it into a position in which the printed circuit board forms the lower base of the vat and the coating material in the vat can spread over the surfaces to be coated to wet same, thereafter moving the vat with the printed circuit board into a position in which the excess coating material drains off from the printed circuit board, and thereafter removing the circuit board and subjecting the circuit board to a drying or hardening operation.

2. An apparatus for applying a plastic film to a printed circuit board fitted with electronic components on at least one side, on which printed circuit board there are also areas which are fitted with components and are to be kept free of film, comprising a vat into which can be introduced a coating material in a liquid state with which the surface(s) of the printed circuit board to be coated can be brought into a wetting contact, wherein:

a) the vat includes a plate-shaped base part, from which projects vertically vat wall sections and chimney wall sections for defining chimneys which project island-shaped areas on the printed circuit board that are to remain free of film;

b) the vat can be fixed with its base plate in a defined position on a support plate extending parallel to a base plate and a yoke plate which are spaced from one another and are connected fixedly with one another to form a frame, the support plate being arranged between these plates and being movable back and forth vertically with respect to these plates;

c) the yoke plate has an opening with edges on which the printed circuit board can be fixed in a defined position with the side to be coated facing toward the vat so that the contours of its surface(s) to be coated are arranged congruent with inner edges of the exposed rims of the wall sections forming the vat wall and;

d) the frame is supported pivotally about a horizontal axis on a machine frame, with reference to a base position of the frame in which its base plate extends horizontally and is below the support plate, and can pivot at least 180° about said horizontal axis.

3. An apparatus according to claim 2, characterized in that the pivot axis of the frame, viewed in a base position prior to pivoting in which the vat base is arranged horizontally and the vat wall extends upwardly, is disposed at a vertical distance above the support plate and preferably above the yoke plate.

4. An apparatus according to claim 2, wherein the printed circuit board can be supported on a side of the yoke plate which does not face the support plate by opening edges of said yoke plate, and can be held on the frame by a closing plate that can be pushed against the soldering side of the printed circuit board which does not face the components, and fixed on the yoke plate, or just fixed on the yoke plate.

5. An apparatus according to claim 4, wherein the closing plate has on its side facing the soldering side of the printed circuit board a pressure cushion which can be soaked with a coating material.

6. An apparatus according to claim 5, characterized wherein the closing plate can be pivoted about an axis which is laterally spaced from a longitudinal edge of the opening of the yoke plate and extends parallel to same between a horizontal open position and a closed position covering the opening.

7. An apparatus for applying a plastic film to a printed circuit board fitted with electronic components on at least one side, on which printed circuit board there are also areas which are fitted with components and are to be kept free of film, comprising a vat into which can be introduced a coating material which is in a liquid state with which the surface(s) of the printed circuit board to be coated can be brought into a wetting contact, wherein:
- a) A vat wall is provided on a pivotal mounting, on which vat wall can be pressed from a free side the printed circuit board the printed circuit board being fixable on the vat wall;
- b) the printed circuit board fixed on the vat wall can be pivoted together with the vat wall into a position in which the coating material can be supplied from above into the vat formed by the wall and the printed circuit board; and
- c) the printed circuit board can be removed from the vat wall in a position assumed after the excess coating material has been emptied out of the vat, in which position the printed circuit board is arranged on an upper side of the vat wall.

8. An apparatus according to claim 3, wherein the printed circuit board can be supported on a side of the yoke plate which does not face the support plate by opening edges of said yoke plate, and can be held on the frame by a closing plate that can be pushed against the soldering side of the printed circuit board which does not face the components, and fixed on the yoke plate, or just fixed on the yoke plate.

9. An apparatus according to claim 8, wherein the closing plate has on its side facing the soldering side of the printed circuit board a pressure cushion which can be soaked with a coating material.

10. An apparatus according to claim 9, wherein the closing plate can be pivoted about an axis which is laterally spaced from a longitudinal edge of the opening of the yoke plate and extends parallel to same between a horizontal open position and a closed position covering the opening.

11. An apparatus according to claim 2, wherein the printed circuit board can be supported on a side of the yoke plate which does not face the support plate by opening edges of said yoke plate, and can be held on the frame by a closing plate that can be pushed against the soldering side of the printed circuit board which does not face the components, and fixed on the yoke plate, or just fixed on the yoke plate.

12. An apparatus according to claim 11, wherein the closing plate has on its side facing the soldering side of the printed circuit board a pressure cushion which can be soaked with a coating material.

13. An apparatus according to claim 12, wherein the closing plate can be pivoted about an axis which is laterally spaced from a longitudinal edge of the opening of the yoke plate and extends parallel to same between a horizontal open position and a closed position covering the opening.

14. An apparatus according to claim 3, wherein the printed circuit board can be supported on a side of the yoke plate which does not face the support plate by opening edges of said yoke plate, and can be held on the frame by a closing plate that can be pushed against the soldering side of the printed circuit board which does not face the components, and fixed on the yoke plate, or just fixed on the yoke plate.

15. An apparatus according to claim 14, wherein the closing plate has on its side facing the soldering side of the printed circuit board a pressure cushion which can be soaked with a coating material.

16. An apparatus according to claim 15, wherein the closing plate can be pivoted about an axis which is laterally spaced from a longitudinal edge of the opening of the yoke plate and extends parallel to same between a horizontal open position and a closed position covering the opening.

* * * * *